United States Patent [19]
Minneman et al.

[11] Patent Number: 5,386,188
[45] Date of Patent: Jan. 31, 1995

[54] IN-CIRCUIT CURRENT MEASUREMENT

[75] Inventors: Michael Minneman, Hudson; Kenneth A. Reindel, Broadview Heights; John G. Banaska, Brunswick; Gary K. Bish, Cleveland; Andy J. Creque, Macedonia; Michael Atwell, Broadview Heights, all of Ohio

[73] Assignee: Keithley Instruments, Inc., Cleveland, Ohio

[21] Appl. No.: 5,227

[22] Filed: Jan. 15, 1993

[51] Int. Cl.$^6$ .................................... G01R 19/00
[52] U.S. Cl. ................................ 324/126; 324/704; 324/713; 324/715; 364/483
[58] Field of Search ............... 324/691, 704, 713, 715, 324/719, 126; 364/482, 483

[56] References Cited
U.S. PATENT DOCUMENTS

| | | | |
|---|---|---|---|
| 3,611,125 | 10/1971 | Press et al. | 324/715 |
| 3,995,213 | 11/1976 | Robinson et al. | 324/715 |
| 5,166,627 | 11/1992 | Kikta et al. | 324/713 X |
| 5,239,270 | 8/1993 | Desbiens | 324/719 |

Primary Examiner—Gerard R. Strecker
Assistant Examiner—Diep Do
Attorney, Agent, or Firm—Pearne, Gordon, McCoy & Granger

[57] ABSTRACT

A current in a circuit is measured without breaking the circuit. A relatively low resistance element in the circuit such as a component lead is chosen. A current is forced through the element and the voltage drop measured. Another current is forced through the element and the voltage drop measured. The values of these currents and voltages are used to determine the original current in the circuit.

14 Claims, 1 Drawing Sheet

IN-CIRCUIT CURRENT MEASUREMENT

BACKGROUND OF THE INVENTION

This invention relates to the measurement of currents in an operating circuit and, in particular, to the measurement of such currents without breaking the circuit.

The most straightforward method of measuring the electrical current in an operating circuit is to break the circuit at some point and insert a current measuring device such as a current meter. The circuit is then reestablished through the current measuring device and the current measured.

Breaking the circuit and inserting the measuring device is typically inconvenient at best and often very difficult. In the case of an electronic circuit on a printed circuit board, for example, it may involve cutting circuit traces or unsoldering components.

In the case of ac currents, it is common to sense large current inductively in order to avoid the problems of inserting the measuring device into the circuit. Unfortunately, this is of little help for small ac currents and for dc currents.

DC currents are sometimes sensed with magnetic sensors such as Hall-effect devices. This avoids the problems of inserting the measurement device into the circuit. Unfortunately, this method works poorly for small currents and it is difficult to get reliable and accurate results.

SUMMARY OF THE INVENTION

The present invention provides a method for the accurate and reliable measurement of currents in a circuit without breaking the circuit to insert a measuring device.

The method for measuring current $I_0$ in a circuit includes selecting an element in the circuit having a low resistance with respect to the remainder of the circuit. This element remains connected in the circuit.

A current source is connected in parallel with the element. The current source has an output current and a current control input for controlling the output current.

A voltage measuring device is connected in parallel with both the element and the current source. The voltage measuring device has a voltage measurement output for providing a voltage measurement across the element and a voltage measurement control input for controlling the voltage measurement process.

A control device is connected to the current control input and the voltage measurement control input.

A calculation device having a calculation control input is connected to the control device.

A first current $I_1$ is driven through the element with the current source and a first voltage $V_1$ across the element is measured with the measuring device, all in response to the control device. The first current is at or near zero.

A second current $I_2$ is driven through the element with the current source and a second voltage $V_2$ across the element is measured with the measuring device, all in response to the control device. The second current is greater than the first current.

A value for the current $I_0$ is calculated with the calculation device in response to the control device according to $$I_0 = \frac{V_1 \cdot (I_2 - I_1)}{V_2 - V_1}$$

The calculated value is provided to a user or to an automated test system in response to the control device.

DESCRIPTION OF THE PREFERRED EMBODIMENTS

Figure 1:
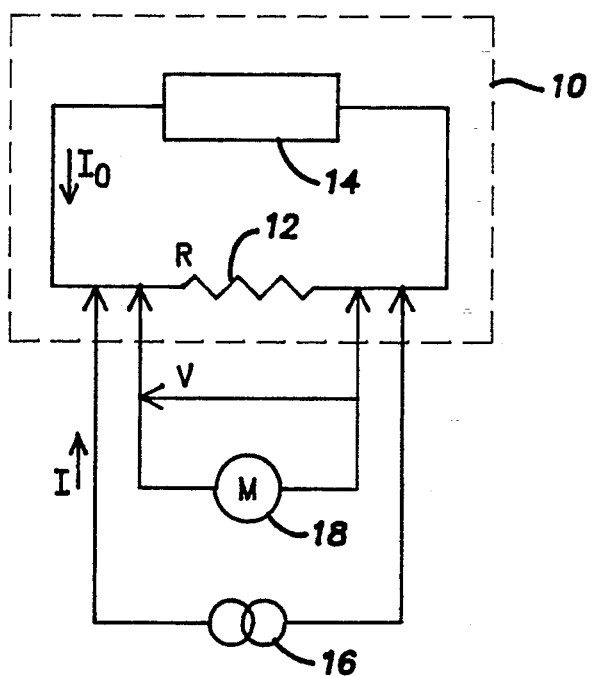
FIG. 1 is a schematic diagram of an electrical circuit for practicing the method of the invention.

Referring to FIG. 1, an operating circuit 10 to be tested is arbitrarily divided into a resistive element 12 and the remainder of the circuit 14. An unknown current $I_0$ passes through the element 12 creating a voltage drop $V_0$. From Ohm's Law, the element 12 has a resistance R equal to the ratio of $V_0$ to $I_0$, or $$I_0 = \frac{V_0}{R}$$

A current source 16 is connected in parallel with the element 12 along with a voltage measuring device 18.

Assuming for a moment that all of the current I from the source 16 passes through the element 12, the follow analysis applies.

If a first value for I, $I_1$ is driven through the element 12, the voltage V takes on a value $V_1$, where $$V_1 = V_0 + I_1 \cdot R$$

If a second value for I, $I_2$ (greater than $I_1$) is driven through the element 12, the voltage V takes on a value $V_2$, where $$V_2 = V_0 + I_2 \cdot R$$

Subtracting these two equations and solving for R gives $$R = \frac{V_2 - V_1}{I_2 - I_1}$$

The current $I_0$ can then be expressed as $$I_0 = \frac{V_0 \cdot (I_2 - I_1)}{V_2 - V_1}$$

As an alternative, if the current $I_1$ is at or near zero (e.g., 10 nanoamperes), then $V_1 = V_0$ to a high degree of accuracy and the equation for $I_0$ becomes $$I_0 = \frac{V_1 \cdot (I_2 - I_1)}{V_2 - V_1}$$

It was assumed above that all of the current I passes through the element 12. The current I actually splits between the two parallel branches constituted by the element 12 and the remainder of the circuit 14. However, if the resistance R of the element 12 is low enough relative to the resistance of the remainder 14, then this assumption can be made as accurate as desired.

Unfortunately, the components of a circuit 10 normally thought of as resistive elements (e.g., resistors) do not typically satisfy this assumption and the above analysis fails.

However, it has been discovered that with proper selection of the "element" this method can be made to produce excellent results.

With a precision dc current source and voltage measuring device (e.g., a Keithley Instruments Model 2001 source/measure unit), resistances as low as one microhm, currents as low as ten picoamperes and voltages as low as ten nanovolts can be measured.

This makes it possible to find resistive elements 12 in the circuit 10 that satisfy the requirement of having a low resistance with respect to the remainder 14 of the circuit 10. Such elements, for example, as component leads, wires and printed circuit traces, or even portions thereof can be used as the element 12.

An exemplary range for the resistance of these elements is one milliohm to ten ohms. The voltage drop across these elements during operation of the circuit is typically in the range of 100 nanovolts to 0.2 volts.

The method of the invention works for ac currents as well as dc currents, but the present state of the resolution and accuracy of ac measurement devices limits the utility of the method for ac currents.

Figure 2:
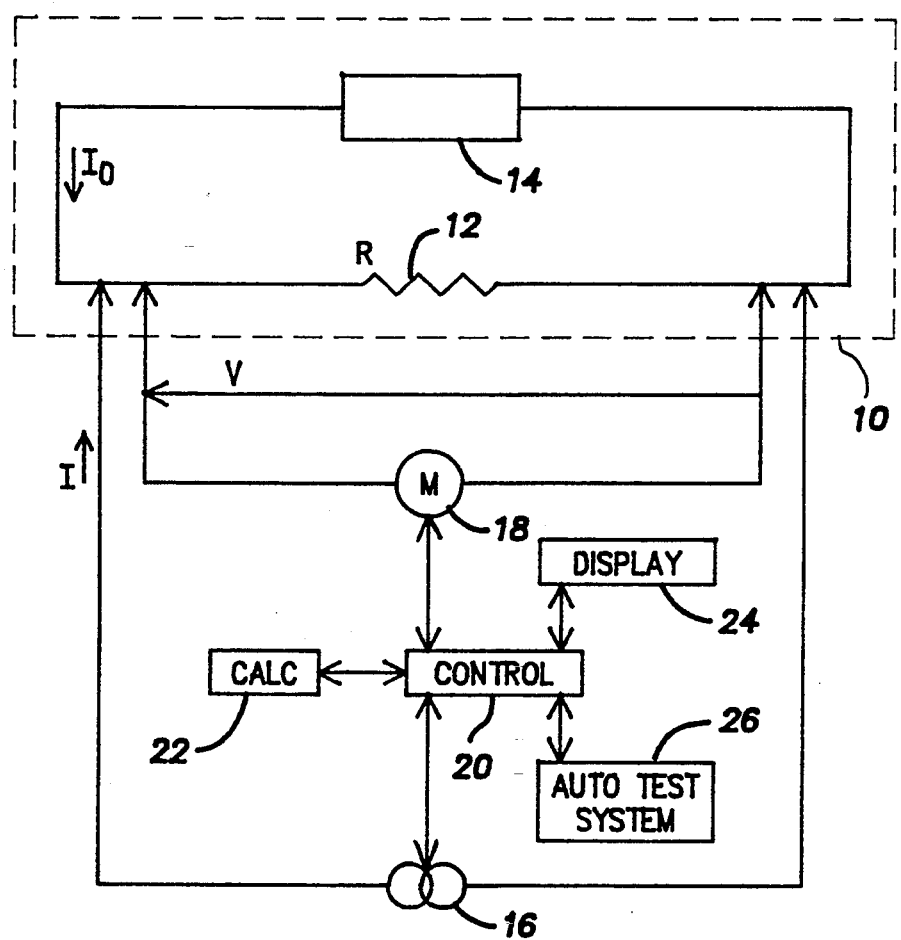
FIG. 2 is a combination block and schematic diagram of a system for practicing the method of the invention.

Referring to FIG. 2, to determine the current $I_0$ present in the circuit 10, the resistive element 12 is selected in the circuit 10 such that the resistance of the element 12 is low with respect to the remainder 14 of the circuit 10. The element 12 may be, for example, a component lead, wire or printed circuit trace, or a portion thereof that contains the current $I_0$.

The current source 16 is connected in parallel with the element 12.

The voltage measuring device 18 is also connected in parallel with the element 12.

A control device 20 communicates with the current source 16 and the measurement device 18. The control device 20 controls the value of the current $I$ produced by the current source 16 and the measurement of the voltage $V$ by the measuring device 18.

The control device 20 also controls a calculation device 22 that performs calculations with the values of the current $I$ and the voltage $V$.

The control device 20 may be, for example, a microprocessor and associated components such as RAM, ROM and buffers.

The calculation device 22 may be, for example, a separate microprocessor or part of the control device 20.

The control device 20 also controls displaying measured and calculated values on a display 24.

The control device 20 also controls the transmission of status information, measured and calculated values to an automated test system 26.

The automated test system 26 may also provide control signals to the control device 20 and to many similar devices with associated source and measure devices. This allows many parameters of a circuit to be measured simultaneously.

In one embodiment of the invention, a current $I_1$ is driven through the element 12 by the source 16 as directed by the control device 20. The current $I_1$ is selected to be at or near zero.

The resulting voltage $V_1$ across the element 12 is measured by the measuring device 18 as directed by the control device 20.

Similarly, a larger current $I_2$ is driven through the element 12 and a voltage $V_2$ measured.

Under direction of the control device 20, the values $I_1$, $V_1$, $I_2$, and $V_2$ are passed to the calculation device 22 and $I_0$ calculated according to $$I_0 = \frac{V_1 \cdot (I_2 - I_1)}{V_2 - V_1}$$

The control device 20 directs the value $I_0$ to be displayed on the display 24 and/or passed to the automatic test system 26.

As an alternative embodiment, the current $I_1$ can be substantially greater than zero, but an additional step of measuring the initial voltage $V_0$ across the element 12 (the voltage $V$ when the current $I$ is zero) is added.

In this embodiment, the values $V_0$, $I_1$, $V_1$, $I_2$, and $V_2$ are passed to the calculation device 22 and $I_0$ calculated according to $$I_0 = \frac{V_0 \cdot (I_2 - I_1)}{V_2 - V_1}$$

In either of the above two embodiments, the measurements may be made in any order.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for measuring current $I_0$ in a circuit, comprising:
   selecting an element in said circuit having a low resistance with respect to a remainder of the circuit, said element remaining connected in said circuit;
   connecting a current source in parallel with said element, said current source having an output current and a current control input for controlling said output current;
   connecting a voltage measuring device in parallel with both said element and said current source, said voltage measuring device having a voltage measurement output for providing a voltage measurement across said element and a voltage measurement control input for controlling said voltage measurement;
   providing a control device connected to said current control input and said voltage measurement control input;
   providing a calculation device having a calculation control input connected to said control device;
   driving a first current $I_1$ through the element with said current source and measuring a first voltage $V_1$ across the element with said measuring device, all in response to said control device, said first current being at or near zero;
   driving a second current $I_2$ through the element with said current source and measuring a second voltage $V_2$ across the element with said measuring device, all in response to said control device, said second current being greater than said first current;
   calculating a value for the current $I_0$ with said calculation device in response to said control device according to $$I_0 = \frac{V_1 \cdot (I_2 - I_1)}{V_2 - V_1} \text{; and}$$

providing the calculated value to a user or to an automated test system in response to said control device.

2. A method according to claim 1, wherein all of said currents are direct current.

3. A method according to claim 1, wherein said element is a printed circuit trace or a portion thereof.

4. A method according to claim 1, wherein said element is a component lead or a portion thereof.

5. A method according to claim 1, wherein said element is a wire or a portion thereof.

6. A method according to claim 1, wherein said element has a resistance of less than 10 ohms.

7. A method according to claim 6, wherein $V_1$ is less than 0.2 volts.

8. A method for measuring current $I_0$ in a circuit, comprising:

selecting an element in said circuit having a low resistance with respect to a remainder of the circuit, said element remaining connected in said circuit;

connecting a current source in parallel with said element, said current source having an output current and a current control input for controlling said output current;

connecting a voltage measuring device in parallel with both said element and said current source, said voltage measuring device having a voltage measurement output for providing a voltage measurement across said element and a voltage measurement control input for controlling said voltage measurement;

providing a control device connected to said current control input and said voltage measurement control input;

providing a calculation device having a calculation control input connected to said control device;

measuring an initial voltage $V_0$ across the element in response to said measuring device;

driving a first current $I_1$ through the element with said current source and measuring a first voltage $V_1$ across the element with said measuring device, all in response to said control device;

driving a second current $I_2$ through the element with said current source and measuring a second voltage $V_2$ across the element with said measuring device, all in response to said control device, said second current being greater than said first current;

calculating a value for the current $I_0$ with said calculation device in response to said control device according to $$I_0 = \frac{V_0 \cdot (I_2 - I_1)}{V_2 - V_1} \text{; and}$$

providing the calculated value to a user or to an automated test system in response to said control device.

9. A method according to claim 8, wherein all of said currents are direct currents.

10. A method according to claim 8, wherein said element is a printed circuit trace or a portion thereof.

11. A method according to claim 8, wherein said element is a component lead or a portion thereof.

12. A method according to claim 8, wherein said element is a wire or a portion thereof.

13. A method according to claim 8, wherein said element has a resistance of less than 10 ohms.

14. A method according to claim 13, wherein $V_0$ is less than 0.2 volts.

* * * * *